United States Patent
Huang et al.

(10) Patent No.: US 9,659,606 B2
(45) Date of Patent: May 23, 2017

(54) DIFFERENTIAL SENSING CIRCUIT WITH DYNAMIC VOLTAGE REFERENCE FOR SINGLE-ENDED BIT LINE MEMORY

(71) Applicant: MEDIATEK INC., Hsin-Chu (TW)

(72) Inventors: Shih-Huang Huang, Hsin-Chu (TW); Rei-Fu Huang, Hsinchu (TW)

(73) Assignee: MediaTek Inc., Hsin-Chu (TW)

(*) Notice: Subject to any disclaimer, the term of this patent is extended or adjusted under 35 U.S.C. 154(b) by 0 days.

(21) Appl. No.: 14/634,898

(22) Filed: Mar. 2, 2015

(65) Prior Publication Data

US 2016/0180894 A1    Jun. 23, 2016

Related U.S. Application Data

(60) Provisional application No. 62/092,852, filed on Dec. 17, 2014.

(51) Int. Cl.
| G11C 7/02 | (2006.01) |
| G11C 7/08 | (2006.01) |
| G11C 7/14 | (2006.01) |
| G11C 7/22 | (2006.01) |

(52) U.S. Cl.
CPC .............. G11C 7/08 (2013.01); G11C 7/14 (2013.01); G11C 7/22 (2013.01)

(58) Field of Classification Search
CPC .................................. G11C 7/14; G11C 7/22

USPC ..................................................... 365/189.09
See application file for complete search history.

(56) References Cited

U.S. PATENT DOCUMENTS

| 2004/0008078 | A1  | 1/2004  | Kim |
| 2010/0039173 | A1* | 2/2010  | Chang .................. G11C 7/067 327/563 |
| 2012/0300566 | A1* | 11/2012 | Mueller ................ G11C 7/062 365/203 |
| 2013/0201773 | A1  | 8/2013  | Kim |
| 2015/0117120 | A1* | 4/2015  | Barth, Jr. .............. G11C 7/067 365/189.02 |

* cited by examiner

*Primary Examiner* — Fernando Hidalgo
(74) *Attorney, Agent, or Firm* — Wolf, Greenfield & Sacks, P.C.

(57) ABSTRACT

The present invention provides a differential sensing circuit with a dynamic voltage reference for a single-ended bit line memory is disclosed. The exemplary differential sensing circuit comprises: a dynamic voltage reference generating unit and a differential sensing amplifying unit. The dynamic voltage reference generating unit is coupled to an input voltage, and utilized for receiving a setting signal to generate the dynamic voltage reference. The differential sensing amplifying unit is coupled to the single-ended bit line memory and the dynamic voltage reference generating unit, and utilized for receiving at least an input signal from the single-ended bit line memory and the dynamic voltage reference from the dynamic voltage reference generating unit, so as to generate at least an output signal accordingly.

13 Claims, 4 Drawing Sheets

DIFFERENTIAL SENSING CIRCUIT WITH DYNAMIC VOLTAGE REFERENCE FOR SINGLE-ENDED BIT LINE MEMORY

CROSS REFERENCE TO RELATED APPLICATIONS

This application claims the benefit of U.S. Provisional Application No. 62/092,852, filed on Dec. 17, 2014 and included herein by reference.

BACKGROUND

The disclosed embodiments of the present invention relate to a differential sensing circuit, and more particularly, to a differential sensing circuit with a dynamic voltage reference for a single-ended bit line memory.

About a conventional single-ended sensing circuit for a single-ended bit line memory, in order to ensure noise immune operation, the conventional single-ended sensing circuit requires that the bit line is discharged fully (rely on the trip voltage of an inverter, wherein a sense margin is about 0.5 VCC). For this reason, the conventional single-ended sensing circuit reads are typically slower than differential sensing reads. About another conventional single-ended sensing circuit for a single-ended bit line memory, in order to have high performance design, the conventional single-ended sensing circuit adopts large signal sensing feature domino style hierarchical bit lines (i.e. short local read bit-lines). However, the conventional single-ended sensing circuit results in a high power consumption problem.

In addition, please refer to FIG. 1. FIG. 1 is a conventional differential sensing circuit 100 for a single-ended bit line memory. As shown in FIG. 1, the conventional differential sensing circuit 100 comprises: a voltage down converter 102, a reference voltage generator 104 and a differential sensing amplifier 106. However, the conventional differential sensing circuit 100 needs the global voltage down converter 102 to generate the voltage reference for the differential sensing amplifier 106, wherein the global voltage down converter 102 suffers a DC current and requires a larger chip area.

SUMMARY

In accordance with exemplary embodiments of the present invention, a differential sensing circuit with a dynamic voltage reference for a single-ended bit line memory is proposed to solve the above-mentioned problem.

According to a first aspect of the present invention, an exemplary differential sensing circuit with a dynamic voltage reference for a single-ended bit line memory is disclosed. The exemplary differential sensing circuit comprises: a dynamic voltage reference generating unit and a differential sensing amplifying unit. The dynamic voltage reference generating unit is coupled to an input voltage, and utilized for receiving a setting signal to generate the dynamic voltage reference. The differential sensing amplifying unit is coupled to the single-ended bit line memory and the dynamic voltage reference generating unit, and utilized for receiving at least an input signal from the single-ended bit line memory and the dynamic voltage reference from the dynamic voltage reference generating unit, so as to generate at least an output signal accordingly.

Briefly summarized, the differential sensing circuit with the dynamic voltage reference disclosed by the present invention can improve performance and reduce dynamic power without suffering the DC current and requiring a larger chip area for the single-ended bit line memory, and the present invention is suitable for high speed and low power design.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The key idea of the present invention is to use a dynamic voltage reference generating unit to generating a dynamic voltage reference to a differential sensing circuit for a single-ended bit line memory such as like a read-only memory (ROM), a static random access memory (SRAM), a dynamic random access memory (DRAM), or a ternary content addressable memory (TCAM), so as to improve performance and reduce dynamic power without suffering the DC current for the single-ended bit line memory, and the present invention is suitable for high speed and low power design. Further details of the proposed constellation phase rotation scheme are described as below.

Figure 1:
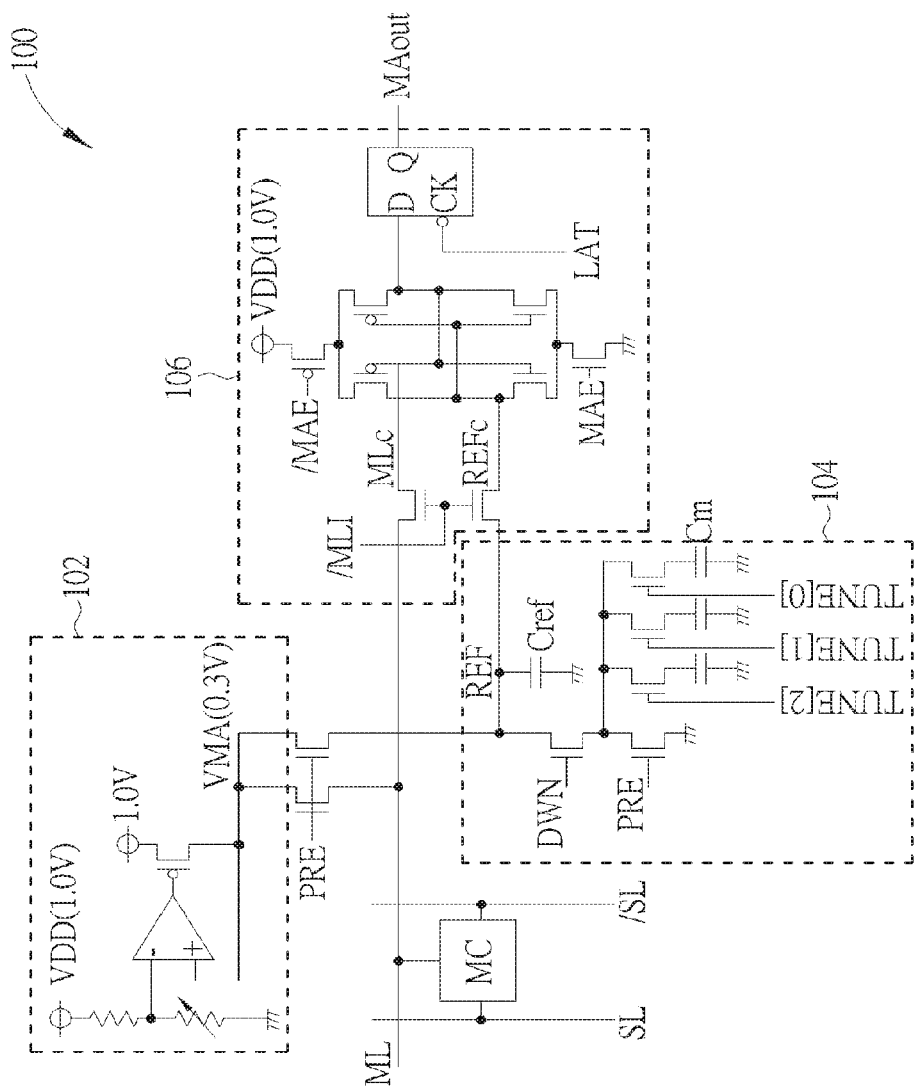
FIG. 1 is a conventional differential sensing circuit for a single-ended bit line memory.
Figure 2:
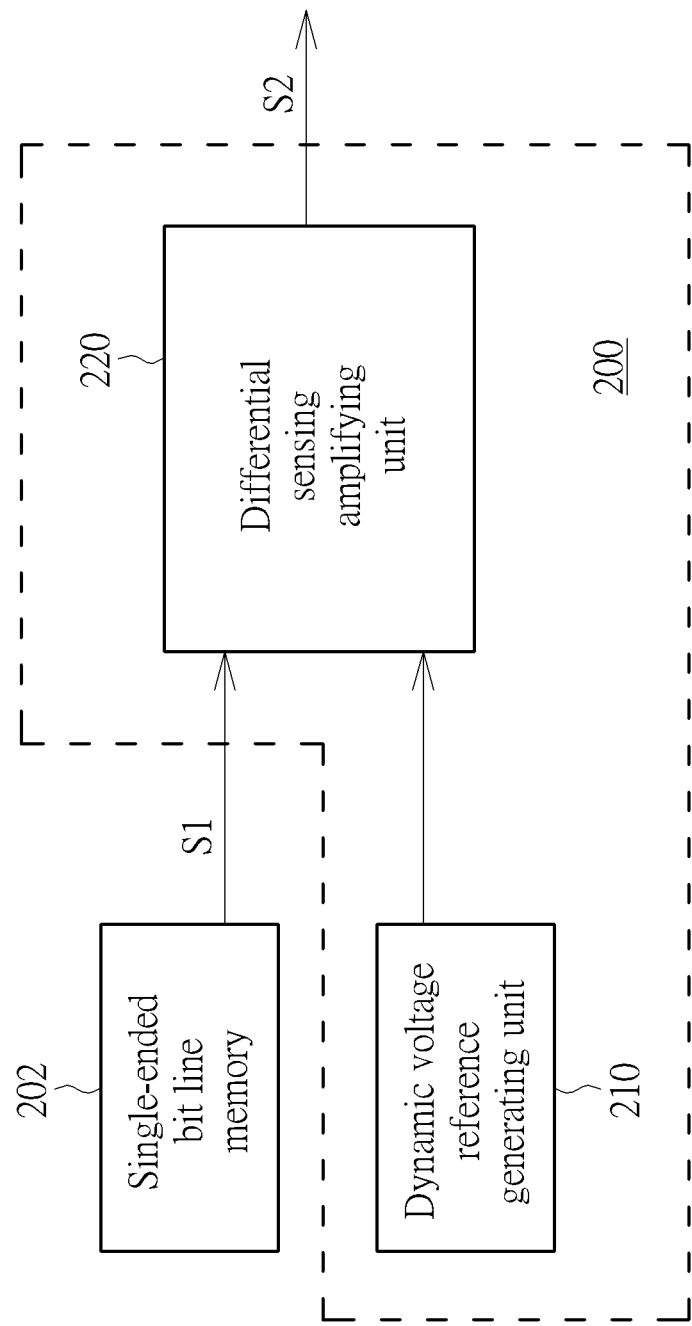
FIG. 2 is a simplified block diagram of a differential sensing circuit with a dynamic voltage reference for a single-ended bit line memory according to an exemplary embodiment of the present invention

Please refer to FIG. 2. FIG. 2 is a simplified block diagram of a differential sensing circuit 200 with a dynamic voltage reference Vref for a single-ended bit line memory 202 according to an exemplary embodiment of the present invention, wherein the single-ended bit line memory 202 can be a ROM, an SRAM, a DRAM, or a TCAM. As shown in FIG. 2, the differential sensing circuit 200 comprises: a dynamic voltage reference generating unit 210 and a differential sensing amplifying unit 220. The dynamic voltage reference generating unit 210 is coupled to an input voltage, and utilized for receiving a setting signal to generate the dynamic voltage reference Vref. The differential sensing amplifying unit 220 is coupled to the single-ended bit line memory 202 and the dynamic voltage reference generating unit 210, and utilized for receiving at least an input signal S1 from the single-ended bit line memory 202 and the dynamic voltage reference Vref from the dynamic voltage reference generating unit 210, so as to generate at least an output signal S2 accordingly. Please note that the above embodiment is only for an illustrative purpose and is not meant to be a limitation of the present invention.

Figure 3:
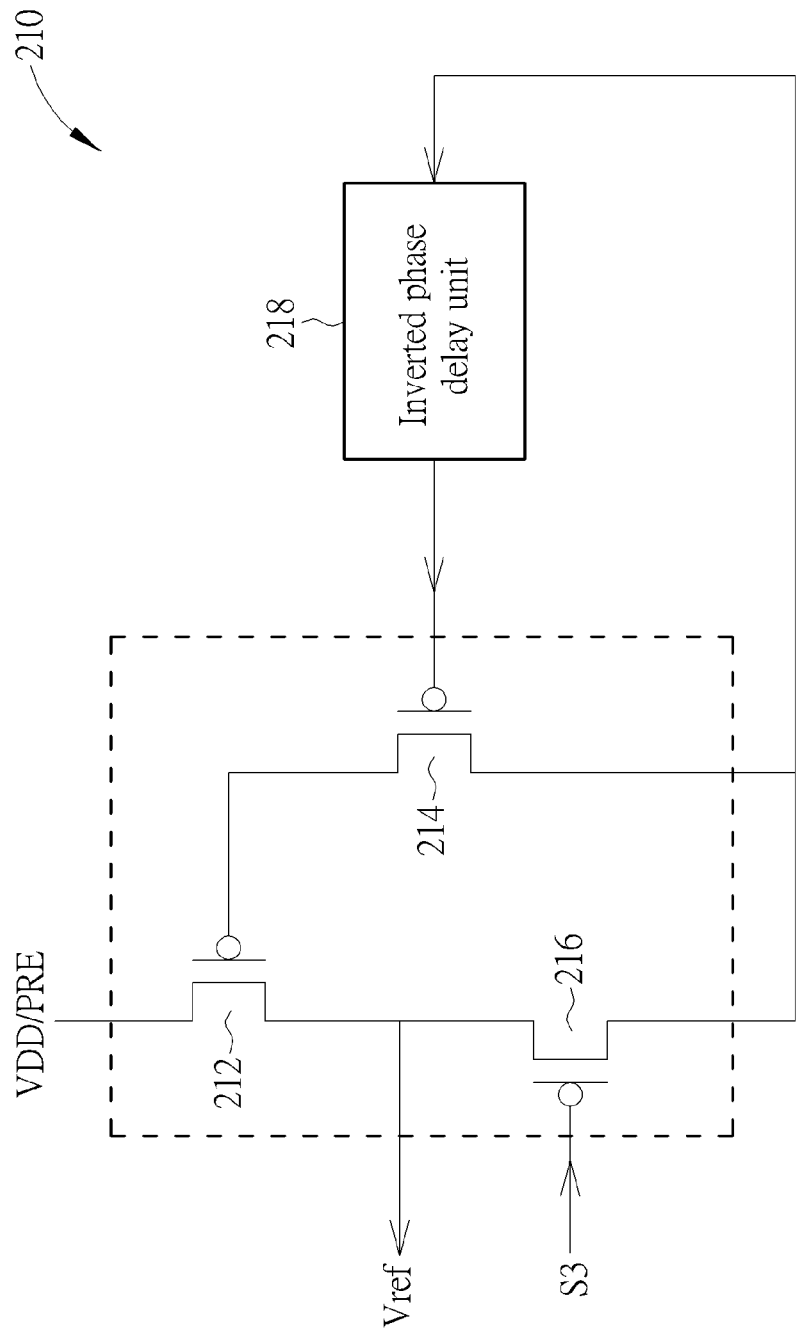
FIG. 3 is a simplified diagram of the dynamic voltage reference generating unit according to a first exemplary embodiment of the present invention.

Please refer to FIG. 3. FIG. 3 is a simplified diagram of the dynamic voltage reference generating unit 210 according to a first exemplary embodiment of the present invention. As shown in FIG. 3, the dynamic voltage reference generating unit 210 comprises: a first switch element 212, a second switch element 214, a third switch element 216, and an inverted phase delay unit 218. The first switch element 212 has a control terminal, a first terminal coupled to the input voltage, and a second terminal coupled to the differential sensing amplifying unit 220 in FIG. 2, wherein the input voltage can be an operating voltage VDD. In another exemplary embodiment, the input voltage also can be a precharging voltage PRE. The second switch element 214 has a control terminal coupled to the inverted phase delay unit 218, a first terminal coupled to the control terminal of the first switch element 212, and a second terminal coupled to the inverted phase delay unit 218. The third switch element 216 has a control terminal coupled to the setting signal S3, a first terminal coupled to the second terminal of the first switch element 212 and the differential sensing amplifying unit 220, and a second terminal coupled to the inverted phase delay unit 218. The inverted phase delay unit 218 has an input terminal coupled to the second terminal of the second switch element 214 and the second terminal of the third switch element 216, and an output terminal coupled to the control terminal of the second switch element 214, wherein the first switch element 212, the second switch element 214, and the third switch element 216 are P-type metal-oxide-semiconductor field-effect transistors (PMOSFETs), and the control terminal is a gate terminal of the PMOSFET, and the first terminal is a source terminal of the PMOSFET, and the second terminal a drain terminal of the PMOSFET. In other words, when the differential sensing circuit 200 comprises the dynamic voltage reference generating unit 210 in the first exemplary embodiment of the present invention, the differential sensing circuit 200 is a VDD differential sensing circuit, and the differential sensing amplifying unit 220 is a VDD differential sensing amplifying unit. When the dynamic voltage reference generating unit 210 receives the setting signal S3, the first switch element 212, the second switch element 214, and the third switch element 216 generate a ΔV, and the dynamic voltage reference generating unit 210 generates the dynamic voltage reference Vref, wherein Vref=VDD−ΔV. Please note that the above embodiment is only for an illustrative purpose and is not meant to be a limitation of the present invention. For example, the number of switch elements the dynamic voltage reference generating unit 210 can be changed according to different design requirements.

In addition, when the at least an inverted phase delay signal of the inverted phase delay unit is fixed (i.e. a number of inverters in inverted phase delay unit is fixed), the dynamic voltage reference Vref generated by the dynamic voltage reference generating unit 210 can be tuned by a ratio of sizes of the first switch element 212, the second switch element 214, and the third switch element 216. For example, if the second switch element 214 has a bigger size while the sizes of the first switch element 212 and the third switch element 216 are not changed, the dynamic voltage reference generating unit 210 generates a lower dynamic voltage reference Vref (i.e. the ΔV is higher). On the other hand, if the second switch element 214 has a smaller size while the sizes of the first switch element 212 and the third switch element 216, the dynamic voltage reference generating unit 210 generates a higher dynamic voltage reference Vref (i.e. the ΔV is lower). In addition, when the ratio of sizes of the first switch element 212, the second switch element 214, and the third switch element 216 is fixed, the dynamic voltage reference Vref generated by the dynamic voltage reference generating unit 210 can be tuned by the inverted phase delay unit. For example, if the inverted phase delay unit 218 has less inverters (e.g. only one inverter), then the dynamic voltage reference generating unit 210 generates a lower dynamic voltage reference Vref (i.e. the ΔV is higher). On the other hand, if the inverted phase delay unit 218 has more inverters (e.g. three of more inverters), the dynamic voltage reference generating unit 210 generates a higher dynamic voltage reference Vref (i.e. the ΔV is lower). In addition, if the differential sensing amplifying unit 220 is replaced by an asymmetric differential sensing amplifying unit, the present invention can improve the performance further for the single-ended bit line memory 202. Please note that the above embodiment is only for an illustrative purpose and is not meant to be a limitation of the present invention.

Figure 4:
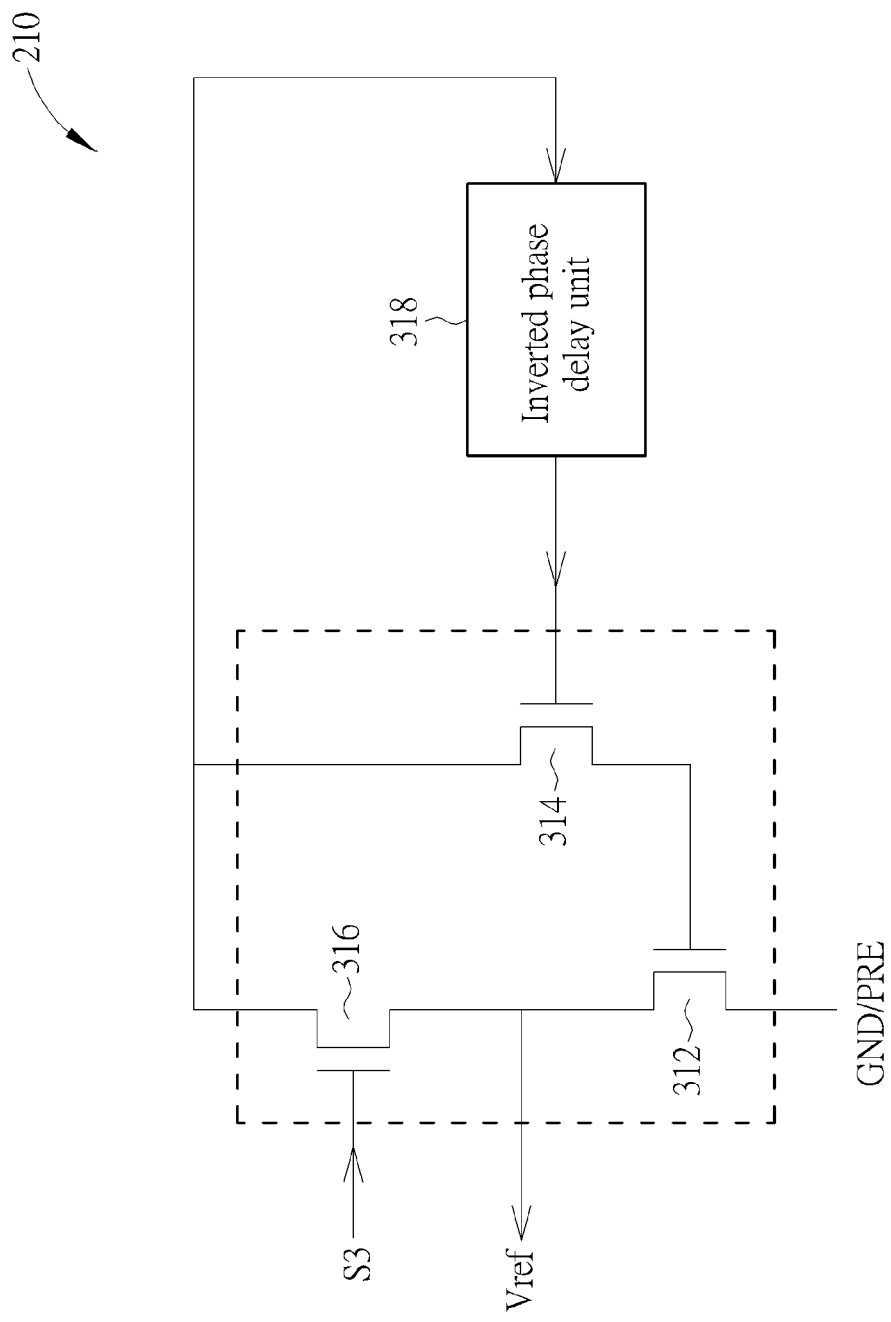
FIG. 4 is a simplified diagram of the dynamic voltage reference generating unit according to a second exemplary embodiment of the present invention.

Please refer to FIG. 4. FIG. 4 is a simplified diagram of the dynamic voltage reference generating unit 210 according to a second exemplary embodiment of the present invention. As shown in FIG. 4, the dynamic voltage reference generating unit 210 comprises: a first switch element 312, a second switch element 314, a third switch element 316, and an inverted phase delay unit 318. The first switch element 312 has a control terminal, a first terminal coupled to the input voltage, and a second terminal coupled to the differential sensing amplifying unit 220 in FIG. 2, wherein the input voltage can be a ground voltage GND. In another exemplary embodiment, the input voltage also can be a precharging voltage PRE. The second switch element 314 has a control terminal coupled to the inverted phase delay unit 318, a first terminal coupled to the control terminal of the first switch element 312, and a second terminal coupled to the inverted phase delay unit 318. The third switch element 316 has a control terminal coupled to the setting signal S3, a first terminal coupled to the second terminal of the first switch element 312 and the differential sensing amplifying unit 220, and a second terminal coupled to the inverted phase delay unit 318. The inverted phase delay unit 318 has an input terminal coupled to the second terminal of the second switch element 314 and the second terminal of the third switch element 316, and an output terminal coupled to the control terminal of the second switch element 314, wherein the first switch element 312, the second switch element 314, and the third switch element 316 are N-type metal-oxide-semiconductor field-effect transistors (NMOSFETs), and the control terminal is a gate terminal of the PMOSFET, and the first terminal is a source terminal of the NMOSFET, and the second terminal a drain terminal of the NMOSFET. In other words, when the differential sensing circuit 200 comprises the dynamic voltage reference generating unit 210 in the second exemplary embodiment of the present invention, the differential sensing circuit 200 is a GND differential sensing circuit, and the differential sensing amplifying unit 220 is a GND differential sensing amplifying unit. When the dynamic voltage reference generating unit 210 receives the setting signal S3, the first switch element 312, the second switch element 314, and the third switch element 316 generate a ΔV, and the dynamic voltage reference generating unit 210 generates the dynamic voltage reference Vref, wherein Vref=ΔV. Please note that the above embodiment is only for an illustrative purpose and is not meant to be a limitation of the present invention. For example, the number of switch elements the dynamic voltage reference generating unit 210 can be changed according to different design requirements.

In addition, when the at least an inverted phase delay signal of the inverted phase delay unit is fixed (i.e. a number of inverters in inverted phase delay unit is fixed), the dynamic voltage reference Vref generated by the dynamic voltage reference generating unit 210 can be tuned by a ratio of sizes of the first switch element 312, the second switch element 314, and the third switch element 316. For example, if the second switch element 314 has a bigger size while the sizes of the first switch element 312 and the third switch element 316 are not changed, the dynamic voltage reference generating unit 210 generates a lower dynamic voltage reference Vref. On the other hand, if the second switch element 314 has a smaller size while the sizes of the first switch element 312 and the third switch element 316, the dynamic voltage reference generating unit 210 generates a higher dynamic voltage reference Vref. In addition, when the ratio of sizes of the first switch element 312, the second switch element 314, and the third switch element 316 is fixed, the dynamic voltage reference Vref generated by the dynamic voltage reference generating unit 210 can be tuned by the inverted phase delay unit. For example, if the inverted phase delay unit 318 has less inverters (e.g. only one inverter), then the dynamic voltage reference generating unit 210 generates a lower dynamic voltage reference Vref. On the other hand, if the inverted phase delay unit 318 has more inverters (e.g. three of more inverters), the dynamic voltage reference generating unit 210 generates a higher dynamic voltage reference Vref. In addition, if the differential sensing amplifying unit 220 is replaced by an asymmetric differential sensing amplifying unit, the present invention can improve the performance further for the single-ended bit line memory 202. Please note that the above embodiment is only for an illustrative purpose and is not meant to be a limitation of the present invention.

Briefly summarized, the differential sensing circuit with the dynamic voltage reference disclosed by the present invention can improve performance and reduce dynamic power without suffering the DC current and requiring a larger chip area for the single-ended bit line memory, and the present invention is suitable for high speed and low power design.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A differential sensing circuit with a dynamic voltage reference for a single-ended bit line memory, the differential sensing circuit comprising:
 a dynamic voltage reference generating unit, coupled to an input voltage, for receiving a setting signal to generate the dynamic voltage reference; and
 a differential sensing amplifying unit, coupled to the single-ended bit line memory and the dynamic voltage reference generating unit, for receiving at least an input signal from the single-ended bit line memory and the dynamic voltage reference from the dynamic voltage reference generating unit, so as to generate at least an output signal accordingly,
 wherein the dynamic voltage reference generating unit comprises:
  a first switch element, having a control terminal, a first terminal coupled to the input voltage, and a second terminal coupled to the differential sensing amplifying unit; and
  a second switch element, having a control terminal, a first terminal coupled to the control terminal of the first switch element, and a second terminal; and
  a third switch element, having a control terminal coupled to the setting signal, a first terminal coupled to the second terminal of the first switch element and the differential sensing amplifying unit, and a second terminal.

2. The differential sensing circuit of claim 1, wherein the input voltage is an operating voltage.

3. The differential sensing circuit of claim 2, wherein the first switch element, the second switch element, and the third switch element are P-type metal-oxide-semiconductor field-effect transistors (PMOSFETs).

4. The differential sensing circuit of claim 1, wherein the input voltage is a ground voltage.

5. The differential sensing circuit of claim 4, wherein the first switch element, the second switch element, and the third switch element are NMOSFETs.

6. The voltage level clamping circuit of claim 1, wherein the dynamic voltage reference generating unit further comprises:
 an inverted phase delay unit, for generating at least an inverted phase delay signal to the dynamic voltage reference generating unit.

7. The differential sensing circuit of claim 6, wherein the inverted phase delay unit has an input terminal coupled to the second terminal of the second switch element and the second terminal of the third switch element, and an output terminal coupled to the control terminal of the second switch element.

8. The differential sensing circuit of claim 6, wherein when the at least an inverted phase delay signal of the inverted phase delay unit is fixed, the dynamic voltage reference generated by the dynamic voltage reference generating unit is tuned by a ratio of sizes of the first switch element, the second switch element, and the third switch element.

9. The differential sensing circuit of claim 8, wherein if the second switch element has a bigger size while the sizes of the first switch element and the third switch element are not changed, then the dynamic voltage reference generating unit generates a lower dynamic voltage reference, and if the second switch element has a smaller size while the sizes of the first switch element and the third switch element are not changed, then the dynamic voltage reference generating unit generates a higher dynamic voltage reference.

10. The differential sensing circuit of claim 6, wherein when a ratio of sizes of the first switch element, the second switch element, and the third switch element is fixed, the dynamic voltage reference generated by the dynamic voltage reference generating unit is tuned by the inverted phase delay unit.

11. The differential sensing circuit of claim 10, wherein if the inverted phase delay unit has less inverters, then the dynamic voltage reference generating unit generates a lower dynamic voltage reference, and if the inverted phase delay unit has more inverters, then the dynamic voltage reference generating unit generates a higher dynamic voltage reference.

12. The differential sensing circuit of claim 10, wherein the differential sensing amplifying unit is an asymmetric differential sensing amplifying unit.

13. The differential sensing circuit of claim 1, wherein the single-ended bit line memory is a read-only memory (ROM), a static random access memory (SRAM), a dynamic random access memory (DRAM), or a ternary content addressable memory (TCAM).

* * * * *